US009048300B2

(12) United States Patent
Chen et al.

(10) Patent No.: US 9,048,300 B2
(45) Date of Patent: Jun. 2, 2015

(54) STRAINED-INDUCED MOBILITY ENHANCEMENT NANO-DEVICE STRUCTURE AND INTEGRATED PROCESS ARCHITECTURE FOR CMOS TECHNOLOGIES

(71) Applicant: Semiconductor Manufacturing International (Shanghai) Corporation, Shanghai (CN)

(72) Inventors: John Chen, Shanghai (CN); Simon Yang, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 208 days.

(21) Appl. No.: 13/716,533

(22) Filed: Dec. 17, 2012

(65) Prior Publication Data
US 2013/0109142 A1 May 2, 2013

Related U.S. Application Data

(60) Continuation of application No. 13/413,122, filed on Mar. 6, 2012, now abandoned, which is a division of application No. 11/244,955, filed on Oct. 5, 2005, now abandoned.

(51) Int. Cl.
*H01L 21/8238* (2006.01)
*H01L 21/77* (2006.01)
(Continued)

(52) U.S. Cl.
CPC ........ *H01L 21/77* (2013.01); *H01L 21/823807* (2013.01); *H01L 21/823814* (2013.01);
(Continued)

(58) Field of Classification Search
USPC .......................................... 438/199
See application file for complete search history.

(56) References Cited

U.S. PATENT DOCUMENTS

| 5,168,072 A | 12/1992 | Moslehi |
| 6,043,545 A | 3/2000 | Tseng et al. |

(Continued)

FOREIGN PATENT DOCUMENTS

| CN | 1499578 A | 5/2004 |
| JP | 2006186240 A | 7/2007 |

(Continued)

OTHER PUBLICATIONS

Belford, et al., "Performance-Augmented CMOS Using Back-End Uniaxial Strain", 2002, Device Research Conference, Santa Barbara, California, pp. 1-2.
(Continued)

*Primary Examiner* — Jack Chen
(74) *Attorney, Agent, or Firm* — Kilpatrick Townsend & Stockton LLP

(57) ABSTRACT

A method for forming a CMOS integrated circuit device, the method including; providing a semiconductor substrate, forming a gate layer overlying the semiconductor substrate, patterning the gate layer to form NMOS and PMOS gate structures including edges; forming a first dielectric layer overlying the NMOS and PMOS gate structures to protect the NMOS and PMOS gate structures including the edges, forming a first masking layer overlying a first region adjacent the NMOS gate structure; etching a first source region and a first drain region adjacent to the PMOS gate structure using the first masking layer as a protective layer for the first region adjacent the NMOS gate structure, and depositing a silicon germanium material into the first source and drain regions to cause the channel region between the first source and drain regions of the PMOS gate structure to be strained in a compressive mode.

17 Claims, 11 Drawing Sheets

(51) Int. Cl.
*H01L 29/66* (2006.01)
*H01L 29/78* (2006.01)
*H01L 29/165* (2006.01)

(52) U.S. Cl.
CPC ......... *H01L29/165* (2013.01); *H01L 29/66628* (2013.01); *H01L 29/66636* (2013.01); *H01L 29/7843* (2013.01); *H01L 29/7848* (2013.01)

(56) References Cited

U.S. PATENT DOCUMENTS

| | | | |
|---|---|---|---|
| 6,121,100 | A | 9/2000 | Andideh et al. |
| 6,179,973 | B1 | 1/2001 | Lai et al. |
| 6,251,242 | B1 | 6/2001 | Fu et al. |
| 6,274,894 | B1 | 8/2001 | Wieczorek et al. |
| 6,277,249 | B1 | 8/2001 | Gopalraja et al. |
| 6,291,321 | B1 | 9/2001 | Fitzgerald |
| 6,352,629 | B1 | 3/2002 | Wang |
| 6,372,569 | B1 | 4/2002 | Lee et al. |
| 6,406,599 | B1 | 6/2002 | Subramani et al. |
| 6,406,973 | B1 | 6/2002 | Lee |
| 6,483,151 | B2 | 11/2002 | Wakabayashi et al. |
| 6,503,773 | B2 | 1/2003 | Fitzgerald |
| 6,514,836 | B2 | 2/2003 | Belford |
| 6,563,152 | B2 | 5/2003 | Roberts et al. |
| 6,566,276 | B2 | 5/2003 | Maloney et al. |
| 6,617,623 | B2 | 9/2003 | Rhodes |
| 6,713,357 | B1 | 3/2004 | Wang |
| 6,730,196 | B2 | 5/2004 | Wang et al. |
| 6,881,635 | B1 | 4/2005 | Chidambarrao et al. |
| 6,891,192 | B2 | 5/2005 | Chen et al. |
| 6,946,350 | B2 | 9/2005 | Lindert et al. |
| 7,052,946 | B2 | 5/2006 | Chen et al. |
| 7,078,722 | B2 | 7/2006 | Anderson et al. |
| 7,195,985 | B2 | 3/2007 | Murthy et al. |
| 7,226,842 | B2 | 6/2007 | Murthy et al. |
| 7,381,623 | B1 | 6/2008 | Chen et al. |
| 7,425,488 | B2 | 9/2008 | Wu et al. |
| 7,446,026 | B2 | 11/2008 | Zhang et al. |
| 7,547,595 | B2 | 6/2009 | Ning |
| 7,557,000 | B2 | 7/2009 | Chen et al. |
| 7,591,659 | B2 * | 9/2009 | Chen et al. .................... 439/199 |
| 7,622,344 | B2 | 11/2009 | Liang et al. |
| 7,709,336 | B2 | 5/2010 | Ning |
| 7,718,500 | B2 | 5/2010 | Chong et al. |
| 7,820,500 | B2 | 10/2010 | Ning |
| 7,838,372 | B2 | 11/2010 | Han et al. |
| 2002/0106845 | A1 | 8/2002 | Chao et al. |
| 2002/0190284 | A1 | 12/2002 | Murthy et al. |
| 2003/0080361 | A1 | 5/2003 | Murthy et al. |
| 2003/0139001 | A1 | 7/2003 | Snyder et al. |
| 2004/0063300 | A1 | 4/2004 | Chi |
| 2005/0035409 | A1 | 2/2005 | Ko et al. |
| 2005/0142768 | A1 | 6/2005 | Lindert et al. |
| 2005/0145956 | A1 | 7/2005 | Wang et al. |
| 2005/0158931 | A1 | 7/2005 | Chen et al. |
| 2005/0179066 | A1 | 8/2005 | Murthy et al. |
| 2006/0052947 | A1 | 3/2006 | Hu |
| 2006/0086987 | A1 | 4/2006 | Chen et al. |
| 2006/0115949 | A1 | 6/2006 | Zhang et al. |
| 2006/0138398 | A1 | 6/2006 | Shimamune et al. |
| 2006/0145273 | A1 | 7/2006 | Curello et al. |
| 2006/0237746 | A1 | 10/2006 | Orlowski et al. |
| 2007/0020864 | A1 | 1/2007 | Chong et al. |
| 2007/0072353 | A1 | 3/2007 | Wu et al. |
| 2007/0072376 | A1 | 3/2007 | Chen et al. |
| 2007/0128786 | A1 | 6/2007 | Cheng et al. |
| 2007/0138570 | A1 | 6/2007 | Chong et al. |
| 2007/0184668 | A1 | 8/2007 | Ning et al. |
| 2007/0196992 | A1 | 8/2007 | Xiang et al. |
| 2008/0119019 | A1 | 5/2008 | Han et al. |
| 2008/0124874 | A1 | 5/2008 | Park et al. |
| 2008/0191244 | A1 | 8/2008 | Kim et al. |
| 2008/0251851 | A1 | 10/2008 | Pan et al. |
| 2008/0283926 | A1 | 11/2008 | Sridhar |
| 2009/0023258 | A1 | 1/2009 | Liang et al. |
| 2009/0065805 | A1 | 3/2009 | Wu et al. |
| 2009/0085125 | A1 | 4/2009 | Kim et al. |
| 2009/0289379 | A1 | 11/2009 | Han et al. |
| 2010/0124818 | A1 | 5/2010 | Lee et al. |
| 2010/0224937 | A1 | 9/2010 | Sridhar |

FOREIGN PATENT DOCUMENTS

| | | | |
|---|---|---|---|
| WO | WO 0154175 | A1 | 7/2001 |
| WO | WO 2005038890 | A1 | 4/2005 |

OTHER PUBLICATIONS

Comita, et al., "Low Temperature Si and SiGe Epitaxy for sub 01.μm Technology", 2003, Epi Technology Development Group Si Deposition Key Product Unit, Applied Materials, pp. 1-3.

Chuang, et al., "Design Considerations of SOI Digital CMOS VLSI", 1998,Proceedings 1998 IEEE International SOI Conference, pp. 5-8.

"Electrical Resistivity and Conductivity—Wikipedia, the Free Encyclopedia", 1 page. Retrieved on Oct. 2, 2011 from http://en.wikipedia.org/wiki/Electrical_resistivity_and_conductivity.

Final Office Action for U.S. Appl. No. 11/471,071, mailed on Jun. 24, 2008, 15 pages.

Final Office Action for U.S. Appl. No. 11/321,767, mailed on Aug. 29, 2008, 7 pages.

Final Office Action for U.S. Appl. No. 11/471,071, mailed on Jul. 14, 2009, 17 pages.

Final Office Action for U.S. Appl. No. 11/678,582, mailed on Oct. 30, 2009, 20 pages.

Final Office Action for U.S. Appl. No. 11/471,071, mailed on Mar. 2, 2010, 9 pages.

Final Office Action for U.S. Appl. No. 11/244,955, mailed on Mar. 26, 2010, 9 pages.

Final Office Action for for U.S. Appl. No. 11/678,582, mailed on Apr. 15, 2010, 21 pages.

Final Office Action for U.S. Appl. No. 11/442,009, mailed on Nov. 19, 2010, 13 pages.

Final Office Action for U.S. Appl. No. 12/234,393, mailed on Nov. 26, 2010, 10 pages.

Final Office Action for U.S. Appl. No. 11/244,955, mailed on Oct. 19, 2011, 9 pages.

Final Office Action for U.S. Appl. No. 11/442,009, mailed on Oct. 5, 2011, 16 pages.

Final Office Action for U.S. Appl. No. 12/234,393, mailed on Apr. 4, 2012, 11 pages.

Ge, et al., "Process-strained Si (PSS) CMOS Technology Featuring 3D Strain Engineering," 2003, IEEE International Electron Devices Meeting, Washington, DC., pp. 1-4.

Non-Final Office Action for U.S. Appl. No. 11/471,071, mailed on Jan. 3, 2008, 18 pages.

Non-Final Office Action for U.S. Appl. No. 11/321,767, mailed on Feb. 25, 2008, 6 pages.

Non-Final Office Action for U.S. Appl. No. 11/471,071, mailed on Nov. 3, 2008, 16 pages.

Non-Final Office Action for U.S. Appl. No. 11/442,009, mailed on Jan. 5, 2009, 20 pages.

Non-Final Office Action for U.S. Appl. No. 11/321,767, mailed on Feb. 18, 2009, 8 pages.

Non-Final Office Action for for U.S. Appl. No. 11/678,582, mailed on Apr. 28, 2009, 18 pages.

Non-Final Office Action for U.S. Appl. No. 11/321,767, mailed on Aug. 31, 2009, 6 pages.

Non-Final Office Action for U.S. Appl. No. 11/244,955, mailed on Sep. 1, 2009, 15 pages.

Non-Final Office Action for U.S. Appl. No. 11/471,071, mailed on Oct. 26, 2009, 18 pages.

Non-Final Office Action for U.S. Appl. No. 12/234,393, mailed on Jun. 8, 2010, 10 pages.

Non-Final Office Action for U.S. Appl. No. 11/442,009, mailed on Jul. 12, 2010, 13 pages.

Non-Final Office Action for U.S. Appl. No. 11/244,955, mailed on Dec. 22, 2010, 9 pages.

(56) References Cited

OTHER PUBLICATIONS

Non-Final Office Action for U.S. Appl. No. 11/678,582, mailed on Apr. 6, 2011, 22 pages.
Non-Final Office Action for U.S. Appl. No. 11/442,009, mailed on Apr. 27, 2011, 11 pages.
Non-Final Office Action for U.S. Appl. No. 12/234,393, mailed on Oct. 12, 2011, 10 pages.
Non-Final Office Action for U.S. Appl. No. 13/413,122, mailed on Jun. 22, 2012, 9 pages.
Notice of Allowance for U.S. Appl. No. 11/609,748, mailed on Mar. 24, 2009, 6 pages.
Notice of Allowance for U.S. Appl. No. 11/321,767, mailed on Dec. 16, 2009, 3 pages.
Notice of Allowance for U.S. Appl. No. 11/471,071, mailed on Jun. 4, 2010, 3 pages.
Notice of Allowance for U.S. Appl. No. 11/471,071, mailed on Jul. 16, 2010, 7 pages.
Requirement for Restriction/Election for U.S. Appl. No. 11/321,767 mailed on Jul. 5, 2007, 5 pages.
Restriction Requirement for U.S. Appl. No. 11/244,955, mailed on Apr. 8, 2008, 6 pages.
Restriction Requirement for U.S. Appl. No. 11/244,955, mailed on Jul. 17, 2008, 5 pages.
Requirement for Restriction/Election for U.S. Appl. No. 11/678,582, mailed on Jul. 24, 2008, 3 pages.
Requirement for Restriction/Election for U.S. Appl. No. 12/234,393, mailed on Mar. 10, 2010, 7 pages.
Thompson, S.E., "Strained Silicon MOSFETs: The Next Material Change to Extend Moore's Law," 2004, Spring Material Research Society 2004, pp. 1-37.

* cited by examiner

After spacer & recess etch

After SiGe Growth &
PR removal

After NMOS spacer etch

After NM removal & capping layer ative specific embodiment, the invention pro-
STRAINED-INDUCED MOBILITY ENHANCEMENT NANO-DEVICE STRUCTURE AND INTEGRATED PROCESS ARCHITECTURE FOR CMOS TECHNOLOGIES The present application is a continuation of co-pending U.S. application Ser. No. 13/413,122, filed Mar. 6, 2012, which is a divisional application of U.S. application Ser. No. 11/244,955, filed Oct. 5, 2005, which are commonly assigned and incorporated herein by reference in their entirety for all purposes. The U.S. application Ser. No. 11/244,955 claims the benefit and priority under 35 U.S.C. 119 of Chinese Application No. 200510030311.3, filed Sep. 29, 2005, which is commonly assigned and incorporated herein by reference in its entirety for all purposes.

BACKGROUND OF THE INVENTION

The present invention is directed to integrated circuits and their processing for the manufacture of semiconductor devices. More particularly, the invention provides a method and structures for manufacturing MOS devices using strained silicon structures for advanced CMOS integrated circuit devices. But it would be recognized that the invention has a much broader range of applicability.

Integrated circuits have evolved from a handful of interconnected devices fabricated on a single chip of silicon to millions of devices. Conventional integrated circuits provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of integrated circuits.

Increasing circuit density has not only improved the complexity and performance of integrated circuits but has also provided lower cost parts to the consumer. An integrated circuit or chip fabrication facility can cost hundreds of millions, or even billions, of U.S. dollars. Each fabrication facility will have a certain throughput of wafers, and each wafer will have a certain number of integrated circuits on it. Therefore, by making the individual devices of an integrated circuit smaller, more devices may be fabricated on each wafer, thus increasing the output of the fabrication facility. Making devices smaller is very challenging, as each process used in integrated fabrication has a limit. That is to say, a given process typically only works down to a certain feature size, and then either the process or the device layout needs to be changed. Additionally, as devices require faster and faster designs, process limitations exist with certain conventional processes and materials.

An example of such a process is the manufacture of MOS devices themselves. Such device has traditionally became smaller and smaller and produced faster switching speeds. Although there have been significant improvements, such devices still have many limitations. As merely an example, these devices must become smaller and smaller but still provide clear signals for switching, which become more difficult as the device becomes smaller. That is, switching power becomes about the same order of magnitude as undesirable noise influences. Additionally, these devices are often difficult to manufacture and generally require complex manufacturing processes and structures. These and other limitations will be described in further detail throughout the present specification and more particularly below.

From the above, it is seen that an improved technique for processing semiconductor devices is desired.

BRIEF SUMMARY OF THE INVENTION

According to the present invention, techniques for processing integrated circuits for the manufacture of semiconductor devices are provided. More particularly, the invention provides a method and structures for manufacturing MOS devices using strained silicon structures for CMOS advanced integrated circuit devices. But it would be recognized that the invention has a much broader range of applicability.

In a specific embodiment, the present invention provides a method for forming a CMOS semiconductor integrated circuit devices. The method includes providing a semiconductor substrate, e.g., silicon wafer, silicon on insulator. The method includes forming a dielectric layer (e.g., gate oxide or nitride) overlying the semiconductor substrate and forming a gate layer (e.g., polysilicon, metal) overlying the dielectric layer. The method includes patterning the gate layer to form a gate structure including edges (e.g., a plurality of sides or edges) and forming a dielectric layer or multi-layers overlying the gate structure to protect the gate structure including the edges. The dielectric layer has a thickness of less than 100 nanometers. The method includes etching a source region and a drain region adjacent to the gate structure using the dielectric layer as a protective layer and depositing silicon germanium material into the source region and the drain region to fill the etched source region and the etched drain region. Preferably, the method causes a channel region between the source region and the drain region to be strained in compressive mode from at least the silicon germanium material formed in the source region and the drain region.

In an alternative specific embodiment, the invention provides a CMOS semiconductor integrated circuit device. The CMOS device includes an NMOS device comprising a gate region, a source region, and a drain region and an NMOS channel region formed between the source region and drain region. A silicon carbide material is formed within the source region and formed within the drain region. The silicon carbide material causes the channel region to be in a tensile mode. The CMOS device also has a PMOS device comprising a gate region, a source region, and a drain region. The PMOS device has a PMOS channel region formed between the source region and the drain region. A silicon germanium material is formed within the source region and formed with in the drain region. The silicon germanium material causes the channel region to be in a compressive mode.

In yet an alternative specific embodiment, the present invention provides a method for forming a CMOS integrated circuit device. The method includes providing a semiconductor substrate, e.g., silicon wafer, silicon on insulator. The method includes forming a gate layer overlying the semiconductor substrate and patterning the gate layer to form an NMOS gate structure including edges and a PMOS gate structure including edges. The method includes forming a dielectric layer overlying the NMOS gate structure to protect the NMOS gate structure including the edges and overlying the PMOS gate structure to protect the PMOS gate structure including the edges. Preferably, the method simultaneously etches a first source region and a first drain region adjacent to the NMOS gate structure and etches a second source region and a second drain region adjacent to the PMOS gate structure using the dielectric layer as a protective layer. The method deposits silicon germanium material into the first source region and the first drain region to cause a channel region between the first source region and the first drain region of the PMOS gate structure to be strained in a compressive mode. The method also deposits silicon carbide material into the second source region and second drain region to cause the channel region between the second source region and the second drain region of the NMOS gate structure to be strained in a tensile mode.

In yet an alternative specific embodiment, the present invention provides a PMOS integrated circuit device. The device has a semiconductor substrate comprising a surface region and an isolation region formed within the semiconductor substrate. A gate dielectric layer is formed overlying the surface region of the semiconductor substrate. A PMOS gate layer is formed overlying a portion of the surface region. The PMOS gate layer includes a first edge and a second edge. The device has a first lightly doped region formed within a vicinity of the first edge and a second lightly doped region formed within a vicinity of the second edge. The device also has a first sidewall spacer formed on the first edge and on a portion of the first lightly doped region and a second sidewall spacer formed on the second edge and on a portion of the second lightly doped region. A first etched region of semiconductor substrate is formed adjacent to the first sidewall spacer and a second etched region of semiconductor substrate is formed adjacent to the second sidewall spacer. The device has a first silicon germanium material formed within the first etched region to form a first source/drain region and a second silicon germanium material formed within the second etched region to form a second source/drain region. A PMOS channel region is formed between the first silicon germanium material and the second silicon germanium layer. Preferably, the first silicon germanium material comprises a first surface that has a height above the surface region and the second silicon germanium material comprises a second surface that has a height above the surface region. Preferably, the PMOS channel region exhibits a strained characteristic in compressive mode according to a specific embodiment.

Many benefits are achieved by way of the present invention over conventional techniques. For example, the present technique provides an easy to use process that relies upon conventional technology. In some embodiments, the method provides higher device yields in dies per wafer. Additionally, the method provides a process that is compatible with conventional process technology without substantial modifications to conventional equipment and processes. Preferably, the invention provides for an improved process integration for design rules of 90 nanometers and less. Additionally, the invention provides for increased mobility of holes using a strained silicon structure for CMOS devices. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

According to the present invention, techniques for processing integrated circuits for the manufacture of semiconductor devices are provided. More particularly, the invention provides a method and structures for manufacturing MOS devices using strained silicon structures for CMOS advanced integrated circuit devices. But it would be recognized that the invention has a much broader range of applicability.

Figure 1:
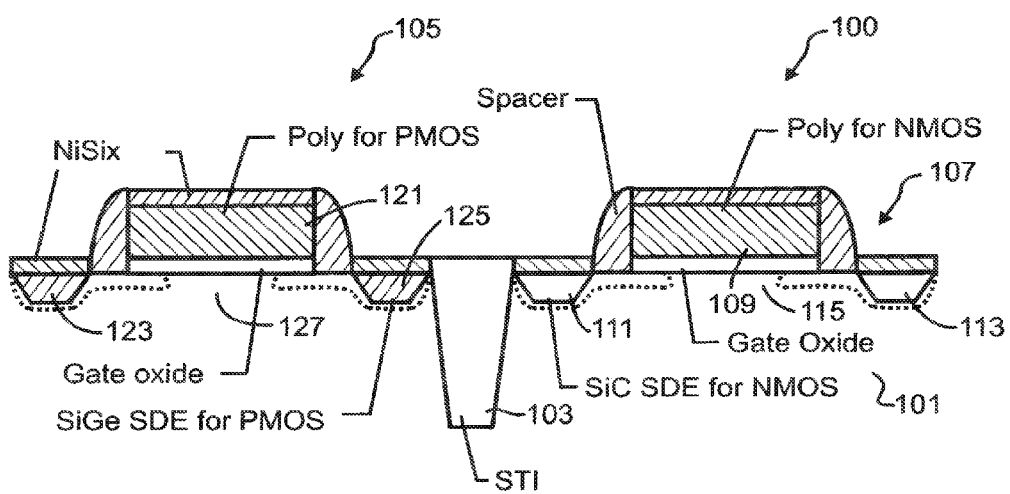
FIG. 1 is a simplified cross-sectional view diagram of a CMOS device according to an embodiment of the present invention.

FIG. 1 is a simplified cross-sectional view diagram of a CMOS device 100 according to an embodiment of the present invention. This diagram is merely an example, which should not unduly limit the scope of the claims herein. One of ordinary skill in the art would recognize many variations, alternatives, and modifications. As shown, the CMOS device includes an NMOS device 107 comprising a gate region 109, a source region 111, a drain region 113 and an NMOS channel region 115 formed between the source region and drain region. Preferably, the channel region has width of less than 90 microns in a preferred embodiment. Of course, there can be other variations, modifications, and alternatives.

A silicon carbide material is formed within the source region 111 and is formed within the drain region 113. That is, the silicon carbide material is epitaxially grown within etched regions of the source and drain regions to form a multilayered structure. The silicon carbide material is preferably doped using an N type impurity. In a specific embodiment, the impurity is phosphorous and has a concentration ranging from about $1 \times 10^{19}$ to about $1 \times 10^{20}$ atoms/cm$^3$. The silicon carbide material causes the channel region to be in a tensile mode. The silicon carbide material has a lattice contact that is less than the lattice constant for single crystal silicon. Since the lattice constant is smaller for silicon carbide, it causes the NMOS channel region to be in a tensile mode. The channel region is longer than for single crystal silicon by about 0.7-0.8 percent in a specific embodiment. The NMOS device is formed in a P-type well region. Of course, there can be other variations, modifications, and alternatives.

The CMOS device also has a PMOS device 105 comprising a gate region 121, a source region 123, and a drain region 125. The PMOS device has a PMOS channel region 127 formed between the source region and the drain region. Preferably, the channel region has width of less than 90 microns in a preferred embodiment. The PMOS device is also formed in N-type well regions. The N-type well region is preferably doped using an N type impurity. Of course, there can be other variations, modifications, and alternatives.

A silicon germanium material is formed within the source region and formed with in the drain region. That is, the silicon germanium material is epitaxially grown within etched regions of the source and drain regions to form a multilayered structure. The silicon germanium material is preferably doped using a P type impurity. In a specific embodiment, the impurity is boron and has a concentration ranging from about $1\times10^{19}$ to about $1\times10^{20}$ atoms/cm$^3$. The silicon germanium material causes the channel region to be in a compressive mode. The silicon germanium material has a lattice contact that is larger than the lattice constant for single crystal silicon. Since the lattice constant is larger for silicon germanium, it tends to cause the PMOS channel region to be in a compressive mode. The channel region is shorter than for single crystal silicon by about 0.7-0.8 percent in a specific embodiment.

As further shown, the device has isolation regions 103, which are formed between active transistor devices, such as the MOS devices. The isolation regions are preferably made using shallow trench isolation techniques. Such techniques often use patterning, etching, and filling the trench with a dielectric material such as silicon dioxide or like material. Of course, one of ordinary skill in the art would recognize other variations, modifications, and alternatives. Further details of a method for fabricating the CMOS device can be found throughout the present specification and more particularly below.

Figure 2:
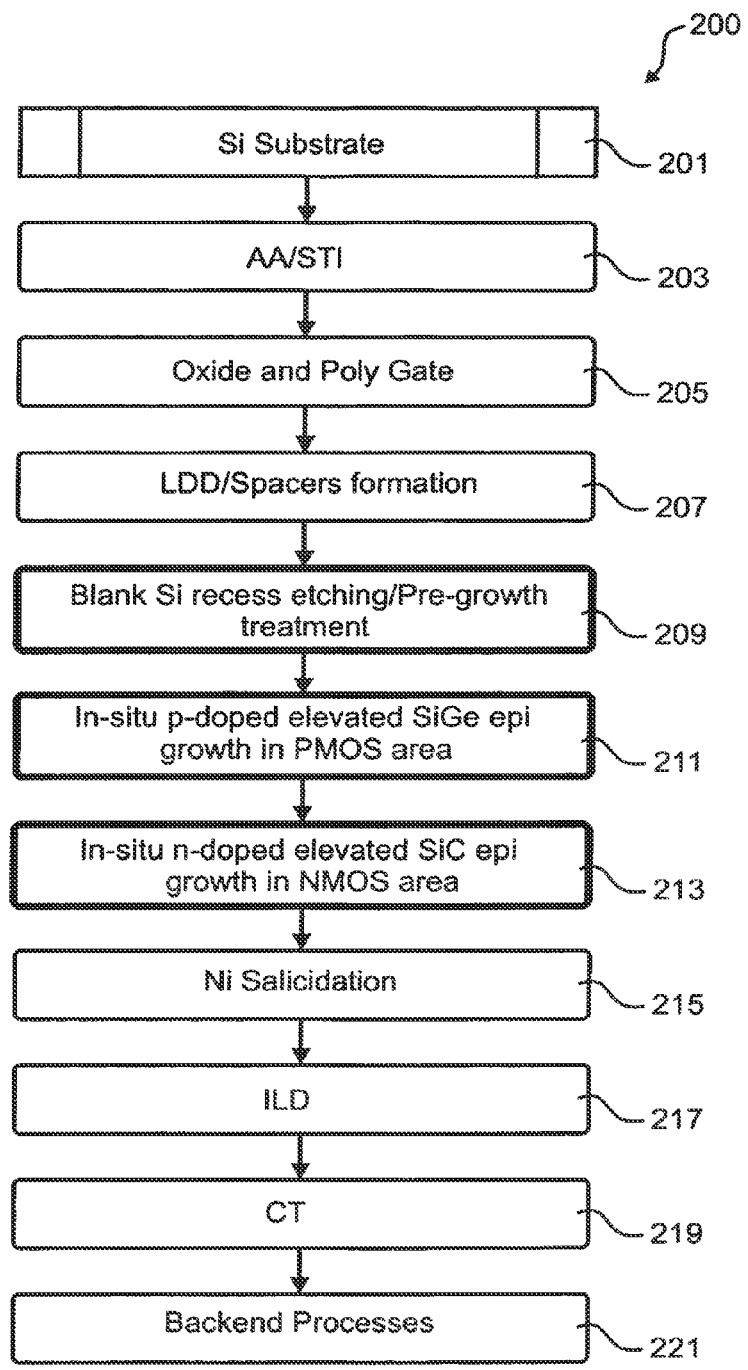
FIG. 2 is a simplified flow diagram illustrating a method for fabricating a CMOS device according to an embodiment of the present invention.
Figure 3:
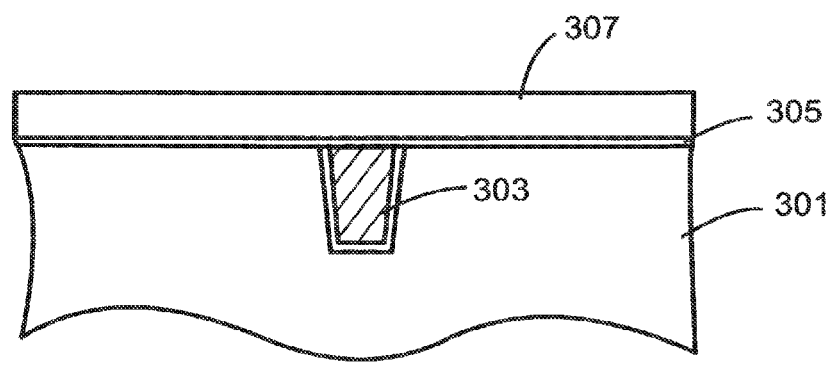
FIGS. 3 through 6 are simplified cross-sectional view diagrams illustrating a method for fabricating a CMOS device according to an embodiment of the present invention.

Referring to FIG. 2 a method 200 for fabricating a CMOS integrated circuit device according to an embodiment of the present invention may be outlined as follows:
1. Provide a semiconductor substrate (step 201), e.g., silicon wafer, silicon on insulator;
2. Form shallow trench isolation regions (step 203);
3. Form a gate dielectric layer (step 205) overlying the surface of the substrate;
4. Form a gate layer overlying the semiconductor substrate;
5. Pattern the gate layer to form an NMOS gate structure including edges and pattern a PMOS gate structure including edges;
6. Form lightly doped drain regions and sidewall spacers (step 207) on edges of patterned gate layer;
7. Form a dielectric layer overlying the NMOS gate structure to protect the NMOS gate structure including the edges and overlying the PMOS gate structure to protect the PMOS gate structure including the edges;
8. Simultaneously etch a first source region and a first drain region adjacent to the NMOS gate structure and etch a second source region and a second drain region adjacent to the PMOS gate structure using the dielectric layer as a protective layer (step 209);
9. Pretreat etched source/drain regions;
10. Mask NMOS regions;
11. Deposit silicon germanium material into the first source region and the first drain region to cause a channel region between the first source region and the first drain region of the PMOS gate structure to be strained in a compressive mode (step 211);
12. Strip Mask from NMOS regions;
13. Mask PMOS regions;
14. Deposit silicon carbide material into the second source region and second drain region to cause the channel region between the second source region and the second drain region of the NMOS gate structure to be strained in a tensile mode (step 213);
15. Form silicide layer overlying gate layer and source/drain regions (step 215); Form interlayer dielectric layer overlying NMOS and PMOS transistor devices (step 217);
17. Form contacts (step 219);
18. Perform back end processes (step 221); and
19. Perform other steps, as desired.

The above sequence of steps provides a method according to an embodiment of the present invention. As shown, the method uses a combination of steps including a way of forming a CMOS integrated circuit device. Other alternatives can also be provided where steps are added, one or more steps are removed, or one or more steps are provided in a different sequence without departing from the scope of the claims herein. Further details of the present method can be found throughout the present specification and more particularly below.

FIGS. 3-6 are simplified diagrams illustrating a method for fabricating a CMOS device according to an embodiment of the present invention. These diagrams are merely examples, which should not unduly limit the scope of the claims herein. One of ordinary skill in the art would recognize many variations, alternatives, and modifications. As shown, the method provides a semiconductor substrate 301, e.g., silicon wafer, silicon on insulator. The semiconductor substrate is single crystalline silicon. The silicon has been oriented in the 100 direction on the face of the wafer. Of course, there can be other variations, modifications, and alternatives. Preferably, the method forms isolation regions within the substrate. In a specific embodiment, the method forms a shallow trench isolation region or regions 303 within a portion of the semiconductor substrate. The shallow trench isolation regions are formed using patterning, etching, and deposition of a dielectric fill material within the trench region. The dielectric fill material is often oxide or a combination of oxide and nitride depending upon the specific embodiment. The isolation regions are used to isolate active regions within the semiconductor substrate.

The method forms a gate dielectric layer 305 overlying the surface of the substrate. Preferably, the gate dielectric layer is oxide or silicon oxynitride depending upon the embodiment. The gate dielectric layer is preferably 10-20 nanometers and less depending upon the specific embodiment. The method forms a gate layer 307 overlying the semiconductor substrate. The gate layer is preferably polysilicon that has been doped using either in-situ doping or ex-situ implantation techniques. The impurity for doping is often boron, arsenic, or phosphorus having a concentration ranging from about $1\times10^{19}$ to about $1\times10^{20}$ atoms/cm$^3$. Of course, one of ordinary skill in the art would recognize many variations, modifications, and alternatives.

Figure 4:
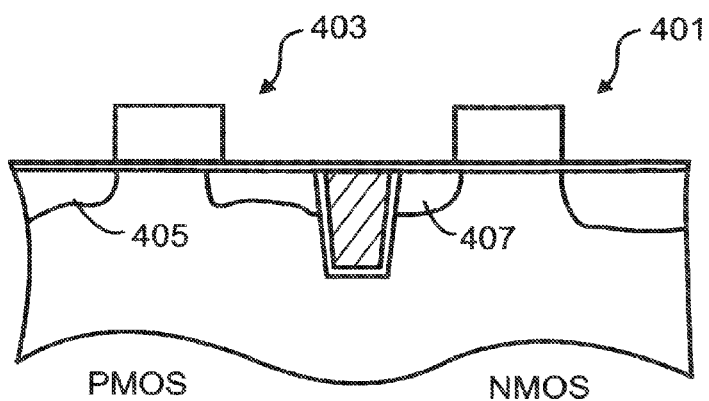

Referring to FIG. 4, the method patterns the gate layer to form an NMOS gate structure 401 including edges and patterns a PMOS gate structure 403 including edges. The method forms lightly doped drain regions 405 407 and optionally sidewall spacers on edges of patterned gate layer. Depending upon the embodiment, there may also be no sidewall spacers. The lightly doped drain regions are often formed using implantation techniques. For the PMOS device, the lightly doped drain region uses Boron or BF$_2$ impurity having a concentration ranging from about $1\times10^{18}$ to about $1\times10^{19}$ atoms/cm$^3$. For the NMOS device, the lightly doped drain region uses arsenic impurity having a concentration ranging from about $1\times10^{18}$ to about $1\times10^{19}$ atoms/cm$^3$. The method forms a dielectric layer overlying the NMOS gate structure to protect the NMOS gate structure including the edges. The method also forms a dielectric protective layer overlying the PMOS gate structure to protect the PMOS gate structure including the edges. Preferably, the dielectric protective layer is the same layer for PMOS and NMOS devices. Alternatively, another suitable material can be used to protect the NMOS and PMOS gate structures, including lightly doped drain regions.

Figure 5:
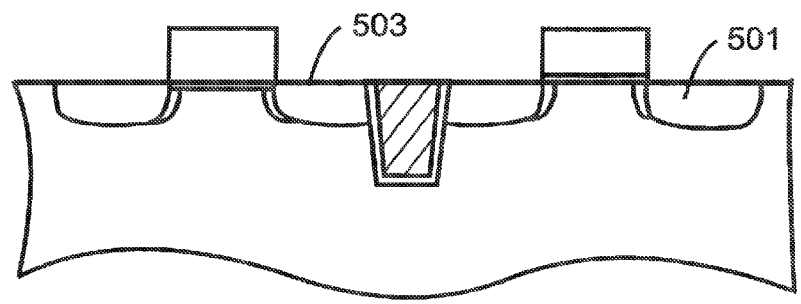
Figure 6:
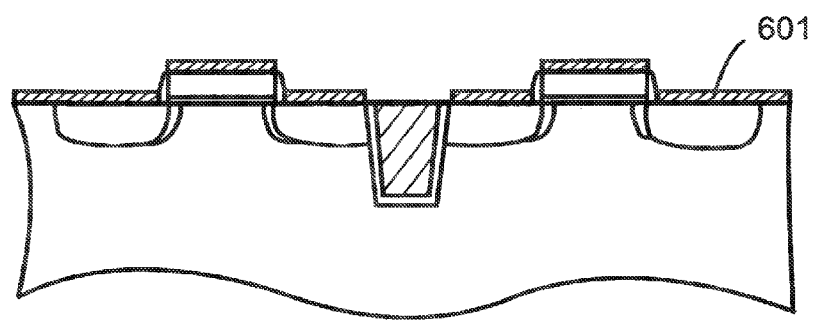

Referring to FIG. 5, the method simultaneously etches a first source region and a first drain region adjacent to the NMOS gate structure 501 and etches a second source region and a second drain region adjacent to the PMOS gate structure 503 using the dielectric layer as a protective layer. The method uses reactive ion etching techniques including a $SF_6$ or $CF_4$ bearing species and plasma environment. In a preferred embodiment, the method performs a pre-treatment process on etched source/drain regions. According to a specific embodiment, the each of the etched regions has a depth of ranging from about 100 Angstroms (A) to about 1000 A and a length of about 0.1 um to about 10 um, and a width of about 0.1 um to about 10 um for a 90 nanometer channel length. Each of the etched regions has a depth of ranging from about 100 A to about 1,000 A and a length of about 0.1 um to about 10 um, and a width of about 0.1 um to about 10 um for a 65 nanometer channel length according to an alternative specific embodiment.

The method masks NMOS regions, while exposing the PMOS etched regions. The method deposits silicon germanium material into the first source region and the first drain region to cause a channel region between the first source region and the first drain region of the PMOS gate structure to be strained in a compressive mode. The silicon germanium is epitaxially deposited using in-situ doping techniques. That is, impurities such as boron are introduced while the silicon germanium material grows. A concentration ranges from about $1\times10^{19}$ to about $1\times10^{20}$ atoms/cm$^3$ of boron according to a specific embodiment. Of course, there can be other variations, modifications, and alternatives.

The method strips the mask from NMOS regions. The method masks PMOS regions, while exposing the NMOS etched regions. The method deposits silicon carbide material into the second source region and second drain region to cause the NMOS channel region between the second source region and the second drain region of the NMOS gate structure to be strained in a tensile mode. The silicon carbide is epitaxially deposited using in-situ doping techniques. That is, impurities such as phosphorous (P) or arsenic (As) are introduced while the silicon carbide material grows. A concentration ranges from about $1\times10^{19}$ to about $1\times10^{20}$ atoms/cm$^3$ of the above impurities according to a specific embodiment. Of course, there can be other variations, modifications, and alternatives.

To finish the device according to an embodiment of the present invention, the method forms a silicide layer 601 overlying gate layer and source/drain regions. Preferably, the silicide layer is a nickel bearing layer such as nickel silicide overlying the exposed source/drain regions and upper surface of the patterned gate layer. Other types of silicide layers can also be used. Such silicide layers include titanium silicide, tungsten silicide, nickel silicide, and the like. The method forms an interlayer dielectric layer overlying NMOS and PMOS transistor devices. The method then provides contact regions, CT. Other steps include performing a back end processes and other steps, as desired.

The above sequence of steps provides a method according to an embodiment of the present invention. As shown, the method uses a combination of steps including a way of forming a CMOS integrated circuit device. Other alternatives can also be provided where steps are added, one or more steps are removed, or one or more steps are provided in a different sequence without departing from the scope of the claims herein.

Figure 7:
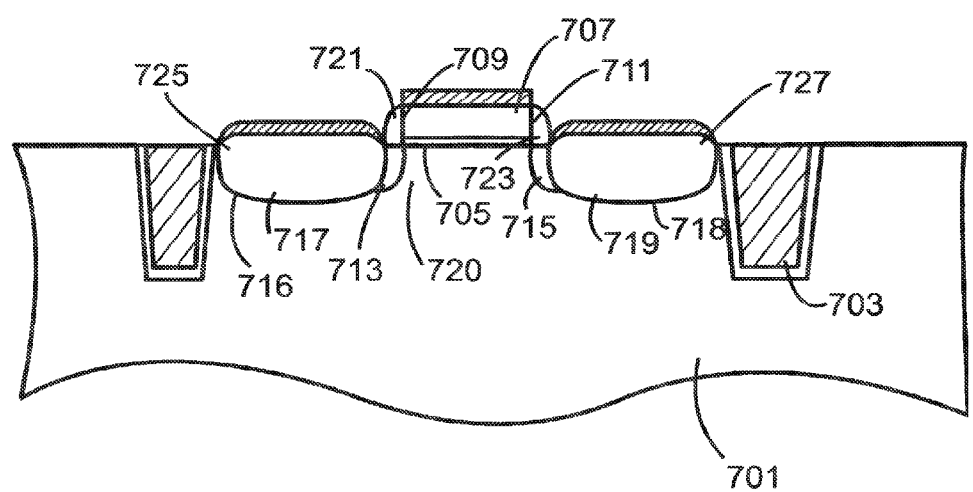
FIG. 7 is a simplified cross-sectional view diagram of an alternative CMOS device according to an alternative embodiment of the present invention.
Figure 8:
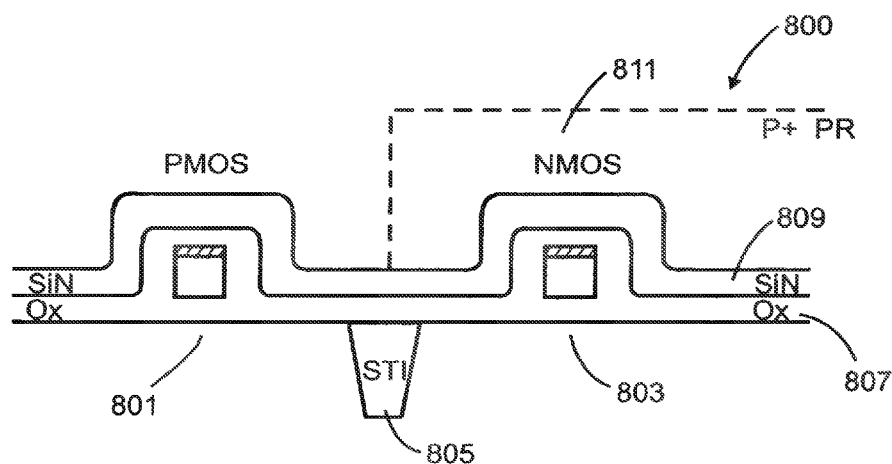
FIGS. 8-13 are simplified cross-sectional view diagrams illustrating an alternative method for fabricating a CMOS device according to an alternative embodiment of the present invention.

FIG. 7 is a simplified cross-sectional view diagram of an alternative CMOS device according to an alternative embodiment of the present invention. This diagram is merely an example, which should not unduly limit the scope of the claims herein. One of ordinary skill in the art would recognize many variations, alternatives, and modifications. As shown, the device is a PMOS integrated circuit device. Alternatively, the device may also be NMOS or the like. The device has a semiconductor substrate 701 (e.g., silicon, silicon on insulator) comprising a surface region and an isolation region 703 (e.g., trench isolation) formed within the semiconductor substrate. A gate dielectric layer 705 is formed overlying the surface region of the semiconductor substrate. A PMOS gate layer 707 is formed overlying a portion of the surface region. The gate layer is preferably doped polysilicon that has been crystallized according to a specific embodiment. The doping is often an impurity such as boron having a concentration ranging from about $1\times10^{19}$ to about $1\times10^{20}$ depending upon the specific embodiment.

The PMOS gate layer includes a first edge 709 and a second edge 711. The device has a first lightly doped region 713 formed within a vicinity of the first edge and a second lightly doped region 715 formed within a vicinity of the second edge. The device also has a first sidewall spacer 721 formed on the first edge and on a portion of the first lightly doped region and a second sidewall spacer 723 formed on the second edge and on a portion of the second lightly doped region. A first etched region of semiconductor substrate is formed adjacent to the first sidewall spacer and a second etched region of semiconductor substrate is formed adjacent to the second sidewall spacer. The device has a first silicon germanium material 717 formed within the first etched region 716 to form a first source/drain region and a second silicon germanium 719 material formed within the second etched region 718 to form a second source/drain region. The silicon germanium layer has been grown using an epitaxial process. The silicon germanium is also doped using an impurity such as boron having a concentration ranging from about $1\times10^{19}$ to about $1\times10^{20}$ depending upon the specific embodiment.

A PMOS channel region 720 is formed between the first silicon germanium material and the second silicon germanium layer. Preferably, the first silicon germanium material comprises a first surface 725 that has a height above the surface region and the second silicon germanium material comprises a second surface 727 that has a height above the surface region. The device has a silicide layer overlying gate layer and source/drain regions. Preferably, the silicide layer is a nickel bearing layer such as nickel silicide overlying the exposed source/drain regions and upper surface of the patterned gate layer, as shown. Of course, there can be other variations, modifications, and alternatives. Further details of the present device can be found throughout the present specification and more particularly below.

A method for fabricating a CMOS integrated circuit device according to an embodiment of the present invention may be outlined as follows:

1. Provide a semiconductor substrate, e.g., silicon wafer, silicon on insulator;
2. Form a dielectric layer (e.g., gate oxide or nitride) overlying the semiconductor substrate;
3. Form a gate layer (e.g., polysilicon, metal) overlying the dielectric layer;
4. Pattern the gate layer to form a gate structure including edges (e.g., a plurality of sides or edges);
5. Form a dielectric layer or multi-layers overlying the gate structure to protect the gate structure including the edges, wherein the dielectric layer being less than 1000 A;
6. Etch a source region and a drain region adjacent to the gate structure using the dielectric layer as a protective layer;
7. Deposit silicon germanium material into the source region and the drain region to fill the etched source region and the etched drain region;

8. Cause a channel region between the source region and the drain region to be strained in compressive mode from at least the silicon germanium material formed in the source region and the drain region, wherein the channel region is about the same width as the patterned gate layer;
9. Form sidewall spacers overlying the patterned gate layer; and
10. Perform other steps, as desired.

The above sequence of steps provides a method according to an embodiment of the present invention. As shown, the method uses a combination of steps including a way of forming a CMOS integrated circuit device. Other alternatives can also be provided where steps are added, one or more steps are removed, or one or more steps are provided in a different sequence without departing from the scope of the claims herein.

FIGS. 8-13 are simplified cross-sectional view diagrams illustrating an alternative method for fabricating a CMOS device according to an alternative embodiment of the present invention. These diagrams are merely examples, which should not unduly limit the scope of the claims herein. One of ordinary skill in the art would recognize many variations, modifications, and alternatives.

Figure 9:
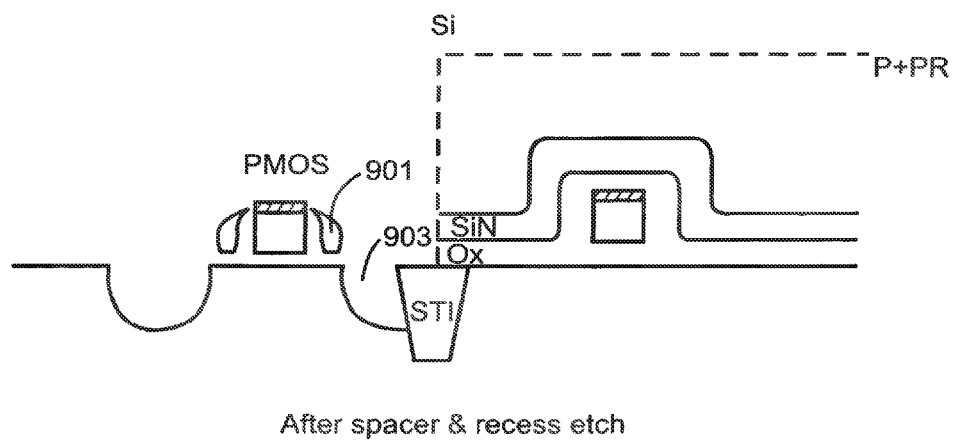
Figure 10:
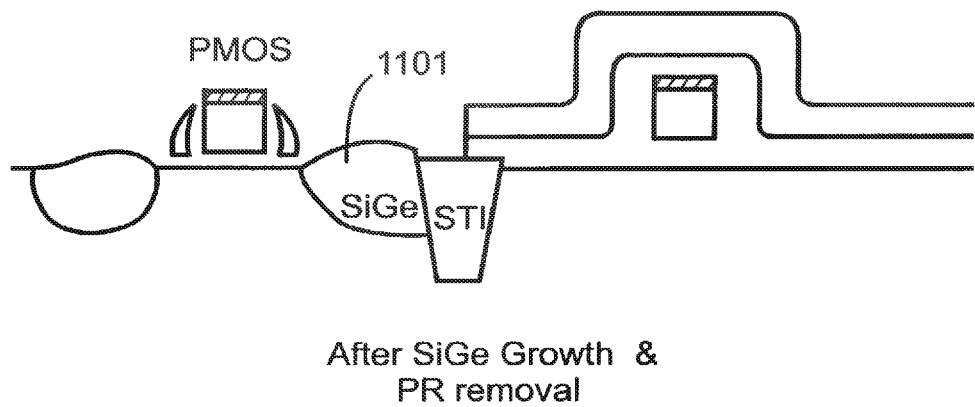
Figure 11:
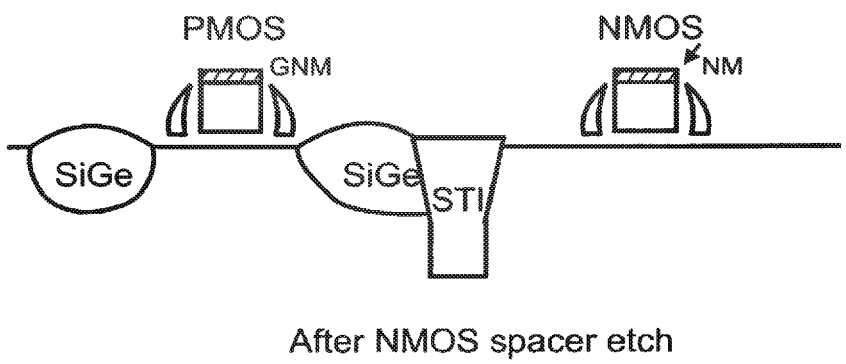
Figure 12:
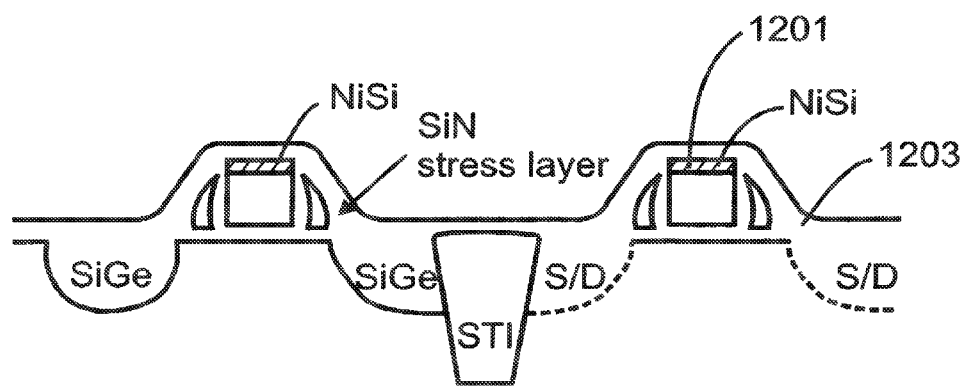
Figure 13:
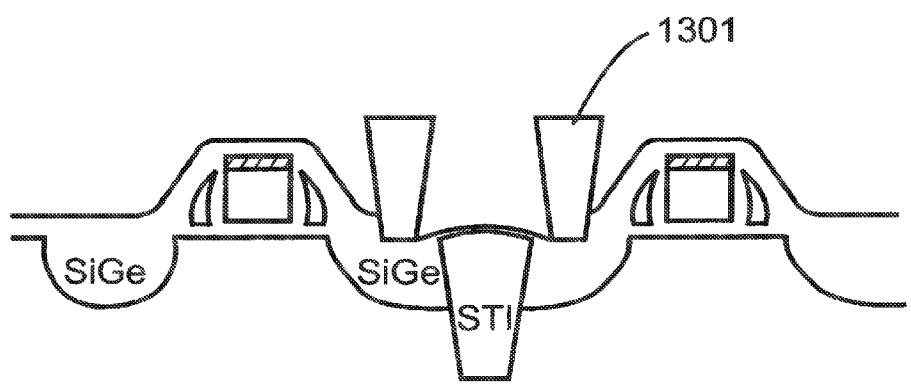

A method illustrating an alternative method for fabricating a CMOS device according to an alternative embodiment of the present invention is briefly outlined below.
1. Provide semiconductor substrate including trench region (shallow trench isolation) 805, including PMOS 801 and NMOS 803 devices thereon (see, FIG. 8);
2. Form overlying oxide layer 807 and overlying silicon nitride layer 809;
3. Form masking layer 811 overlying NMOS devices;
4. Form spacer regions 901 on PMOS devices using masking layer 811 to protect NMOS devices, as illustrated by FIG. 9;
5. Form etched source/drain regions 903 for PMOS devices using the masking layer to protect the NMOS devices;
6. Remove masking layer, as illustrated by FIG. 10;
7. Deposit silicon germanium fill material 1101 into the etched source/drain region, as illustrated by FIG. 10, to cause strain region within the channel region of the PMOS devices;
8. Form spacer regions 1105 for NMOS devices, as illustrated by FIG. 11 and form source/drain regions for NMOS devices;
9. Form silicide material 1201 (e.g., nickel, platinum, titanium) overlying portions of the NMOS and PMOS gate regions, as illustrated by FIG. 12;
10. Form silicon nitride layer 1203 overlying surface regions of the spacer regions, NMOS, and PMOS devices;
11. Cause strain region within NMOS devices using the silicon nitride layer, as illustrated by FIG. 12;
12. Form interlayer dielectric layer or layers overlying the NMOS and PMOS devices;
13. Form contact regions 1301 to source/drain regions of each of the NMOS and PMOS devices; and
14. Perform other steps, as desired.

The above sequence of steps provides a method according to an embodiment of the present invention. As shown, the method uses a combination of steps including a way of forming a CMOS integrated circuit device. Other alternatives can also be provided where steps are added, one or more steps are removed, or one or more steps are provided in a different sequence without departing from the scope of the claims herein.

FIGS. 14-19 are simplified cross-sectional view diagrams illustrating yet an alternative method for fabricating a CMOS device according to an embodiment of the present invention. These diagrams are merely examples, which should not unduly limit the scope of the claims herein. One of ordinary skill in the art would recognize many variations, modifications, and alternatives.

Figure 14:
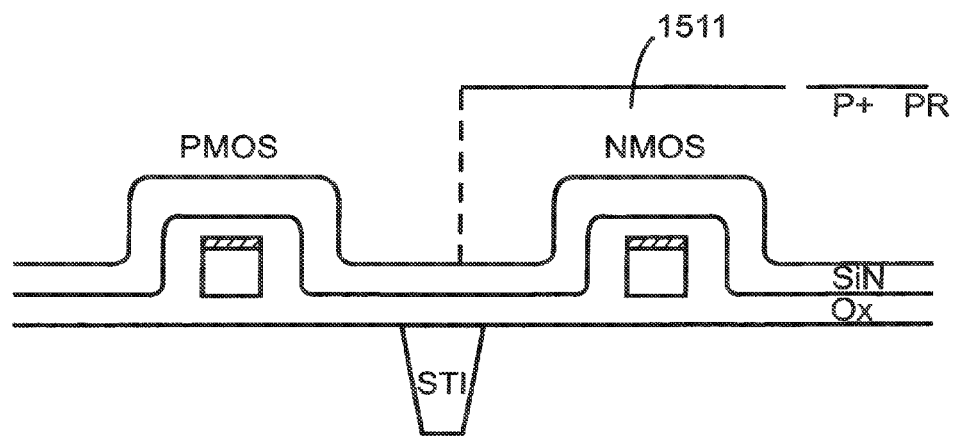
FIGS. 14-19 are simplified cross-sectional view diagrams illustrating yet an alternative method for fabricating a CMOS device according to an embodiment of the present invention.
Figure 15:
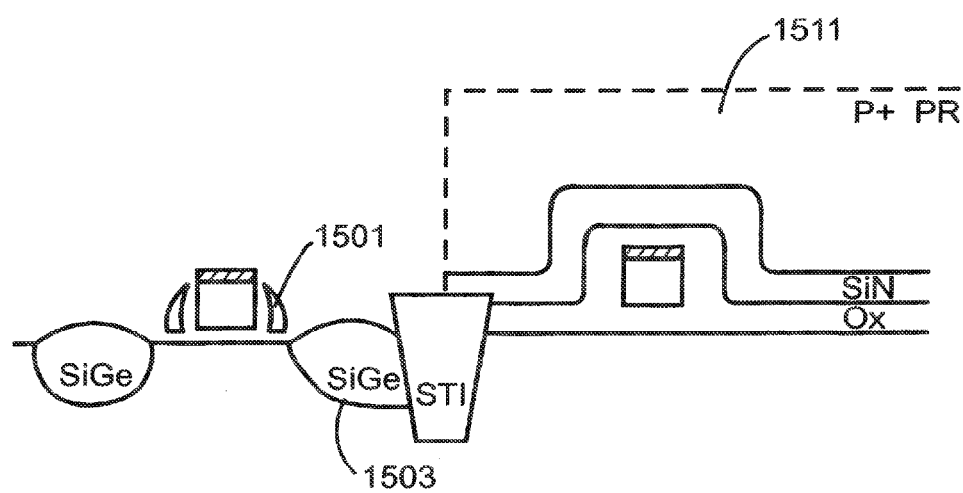
Figure 16:
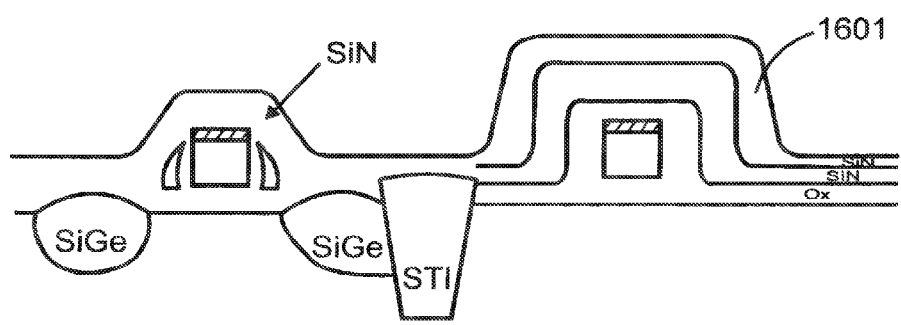
Figure 17:
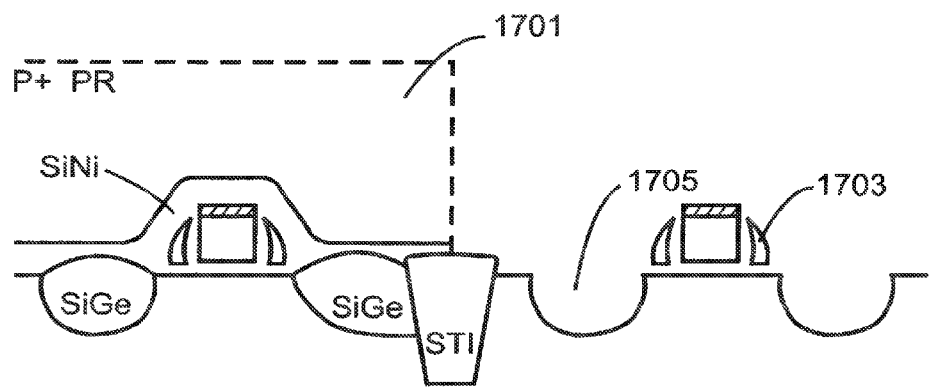
Figure 18:
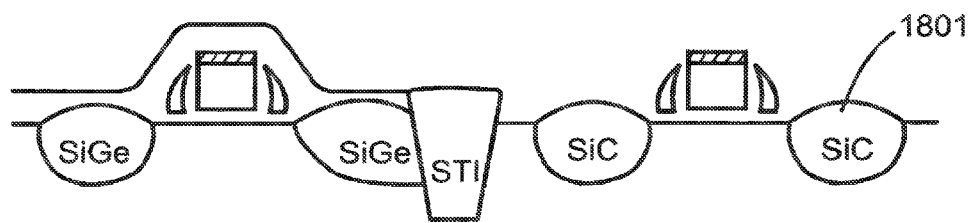
Figure 19:
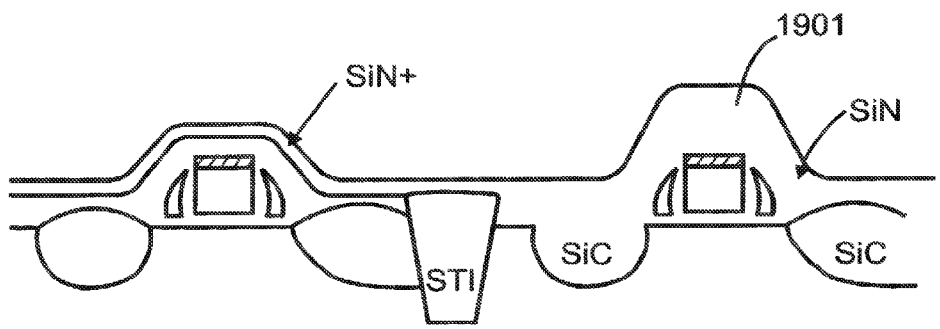

A method illustrating an alternative method for fabricating a CMOS device according to an alternative embodiment of the present invention is briefly outlined below.
1. Provide semiconductor substrate including trench region (shallow trench isolation), including PMOS and NMOS devices thereon (see, FIG. 14);
2. Form overlying oxide layer and overlying silicon nitride layer, as also shown in FIG. 14;
3. Form masking layer 1511 overlying NMOS devices;
4. Form spacer regions 1501 on PMOS devices using masking layer 1511 to protect NMOS devices, as illustrated by FIG. 15;
5. Form etched source/drain regions for PMOS devices using the masking layer to product the NMOS devices;
6. Remove masking layer;
7. Deposit silicon germanium fill material 1503 into the etched source/drain region, as illustrated by FIG. 15, to cause strain region within the channel region of the PMOS devices;
8. Form silicon nitride layer 1601 overlying the NMOS and PMOS devices, including a portion of the silicon nitride layer and the oxide layer overlying the NMOS devices, as illustrated by FIG. 16;
9. Form mask 1701 overlying PMOS devices, as illustrated by FIG. 17;
10. Form spacer regions 1703 for NMOS devices, as illustrated by FIG. 17;
11. Form etched source/drain regions 1705 for NMOS devices and remove masking layer;
12. Form silicon carbide fill material 1801 within the etched source/drain regions to cause strain region (e.g., tensile) within the channel region of the NMOS devices;
13. Optionally, form silicide material (e.g., nickel, platinum, titanium) overlying portions of the NMOS and PMOS gate regions, as illustrated by FIG. 18;
14. Form silicon nitride layer 1901 overlying surface regions of the spacer regions, NMOS, and PMOS devices, as illustrated by FIG. 19;
15. Cause additional strain (e.g., tensile) to the strain region within NMOS devices using the silicon nitride layer;
16. Form interlayer dielectric layer or layers overlying the NMOS and PMOS devices;
17. Form contact regions to source/drain regions of each of the NMOS and PMOS devices; and
18. Perform other steps, as desired.

The above sequence of steps provides a method according to an embodiment of the present invention. As shown, the method uses a combination of steps including a way of forming a CMOS integrated circuit device. Other alternatives can also be provided where steps are added, one or more steps are removed, or one or more steps are provided in a different sequence without departing from the scope of the claims herein.

Depending upon the embodiment, there can be various recipes for forming nigh tensile or high compressive stress silicon nitride material depending upon the application. As merely an example, Table 1 lists certain recipes for high tensile (HT) and high compressive (HC) silicon nitride.

DEP CONDITIONS FOR HIGH TENSILE AND
HIGH COMPRESSIVE STRESS SIN

| Parameters | HT SIN | HC SIN |
|---|---|---|
| Max Time/s | 100 | 67 |
| Servo/Torr | 6 | 6 |
| HF RF Pwr/W | 40 | 450 |
| SiH4-Lo/sccm | 30 | 30 |
| NH3/sccm | 80 | 80 |
| N2/sccm | 9000 | 9000 |
| Htr ½(wafer~)/T | 400 | 400 |
| Lift Pos/mils | 480 | 480 |
| Stress/THK = 2K | 948 | −1483 |

Of course, one of ordinary skill in the art would recognize various modifications, alternatives, and variations.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for forming a CMOS integrated circuit device, the method comprising:
   providing a semiconductor substrate;
   forming a gate layer overlying the semiconductor substrate;
   patterning the gate layer to form an NMOS gate structure including edges and a PMOS gate structure including edges;
   forming a first dielectric layer overlying the NMOS gate structure to protect the NMOS gate structure including the edges and overlying the PMOS gate structure to protect the PMOS gate structure including the edges;
   forming a first masking layer overlying a first region adjacent the NMOS gate structure;
   etching a first source region and a first drain region adjacent to the PMOS gate structure using the first masking layer as a protective layer for the first region adjacent the NMOS gate structure; and
   depositing a silicon germanium material into the first source region and the first drain region to cause the channel region between the first source region and the first drain region of the PMOS gate structure to be strained in a compressive mode;
   forming a second dielectric layer after depositing the silicon germanium material, the second dielectric layer overlying the NMOS gate structure and the PMOS gate structure to protect the deposited silicon germanium material, the PMOS gate structure including the edges, and the NMOS gate structure including the edges;
   forming a second masking layer overlying a second region adjacent the PMOS gate structure;
   etching a second source region and a second drain region adjacent to the NMOS gate structure using the second masking layer as a protective layer for the second region adjacent the PMOS gate structure; and
   depositing silicon carbide material into the second source region and the second drain region to cause a channel region between the second source region and the second drain region of the NMOS gate structure to be strained in a tensile mode.

2. The method of claim 1 wherein the compressive mode increases a hole mobility.

3. The method of claim 1 wherein the channel region of the PMOS device has a length of 90 nanometers and less.

4. The method of claim 1 wherein the channel region of the NMOS device has a length of 90 nanometers and less.

5. The method of claim 1 wherein the silicon germanium material is an epitaxial material.

6. The method of claim 1 wherein the silicon germanium material has a thickness ranging from about 200 Angstroms to 1000 Angstroms.

7. The method of claim 1 wherein the depositing the silicon germanium material is an in-situ doped process using a boron species, the boron species having a concentration ranging from about $10^{19}$ to $10^{20}$ atoms/cm$^3$.

8. The method of claim 1 further comprising:
   forming sidewall spacers on the edges of the NMOS gate structure after depositing the silicon germanium material; and
   forming the second source region and the second drain region adjacent to the NMOS gate structure.

9. The method of claim 1 wherein the tensile mode increases an electron mobility.

10. The method of claim 1 wherein the silicon carbide material is an epitaxial material.

11. The method of claim 1 wherein the silicon carbide material has a thickness ranging from about 200 Angstroms to 1000 Angstroms.

12. The method of claim 1 wherein the depositing the silicon carbide material is an in-situ doped process using a phosphorus species, the phosphorus species having a concentration ranging from about $10^{19}$ to $10^{20}$ atoms/cm$^3$.

13. The method of claim 1 further comprising forming a refractory metal layer overlying the first source region and first drain region and the second source region and the second drain region.

14. The method of claim 1 wherein the first source region is an elevated first source region and the first drain region is an elevated first drain region, and the second source region is an elevated second source region and the second drain region is an elevated second drain region.

15. The method of claim 1 further comprising forming sidewall spacers on the edges of the NMOS gate structure after forming the second masking layer.

16. The method of claim 1 further comprising forming a third dielectric layer overlying the NMOS gate structure to cause a channel region between the second source region and the second drain region adjacent to the NMOS gate structure to be strained in a tensile mode.

17. The method of claim 16 wherein the third dielectric layer is silicon nitride deposited with tensile strain.

* * * * *